United States Patent
Ohta et al.

(10) Patent No.: US 10,644,220 B2
(45) Date of Patent: May 5, 2020

(54) PIEZOELECTRIC ELEMENT

(71) Applicant: TDK CORPORATION, Tokyo (JP)

(72) Inventors: Yoshiki Ohta, Tokyo (JP); Hideya Sakamoto, Tokyo (JP); Kazushi Tachimoto, Tokyo (JP); Nobou Furukawa, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 279 days.

(21) Appl. No.: 15/704,605

(22) Filed: Sep. 14, 2017

(65) Prior Publication Data

US 2018/0090665 A1    Mar. 29, 2018

(30) Foreign Application Priority Data

Sep. 29, 2016    (JP) .................................. 2016-191739

(51) Int. Cl.
   *H01L 41/047*    (2006.01)
   *H01L 41/083*    (2006.01)

(52) U.S. Cl.
   CPC ...... *H01L 41/0475* (2013.01); *H01L 41/0471* (2013.01); *H01L 41/0838* (2013.01)

(58) Field of Classification Search
   CPC combination set(s) only.
   See application file for complete search history.

(56) References Cited

U.S. PATENT DOCUMENTS

| | | | |
|---|---|---|---|
| 5,786,655 A * | 7/1998 | Okumura | H01L 41/0471 310/328 |
| 2003/0001931 A1* | 1/2003 | Isono | B41J 2/14209 347/72 |
| 2005/0253270 A1* | 11/2005 | Sasaki | H01L 41/083 257/758 |
| 2005/0253488 A1* | 11/2005 | Ito | B41J 2/14209 310/366 |
| 2007/0210878 A1 | 9/2007 | Yamaguchi et al. | |
| 2011/0175491 A1* | 7/2011 | Miyano | H01L 41/0471 310/323.16 |

(Continued)

FOREIGN PATENT DOCUMENTS

| | | |
|---|---|---|
| CN | 104183694 A | 12/2014 |
| CN | 105977373 A | 9/2016 |

(Continued)

*Primary Examiner* — Bryan P Gordon
(74) *Attorney, Agent, or Firm* — Oliff PLC

(57) ABSTRACT

A piezoelectric element includes a piezoelectric body layer, a first electrode, a second electrode, a third electrode, and a first through-hole conductor. The piezoelectric body layer has rectangular first and second principal surfaces opposing each other, and includes a piezoelectric material. The first electrode is provided on the first principal surface. The second electrode is provided on the first principal surface in such a way that the second electrode is separated from the first electrode. The third electrode is provided on the second principal surface in such a way that the third electrode opposes the first electrode. The through-hole conductor penetrates the piezoelectric body layer and is connected to the second electrode and the third electrode. The first electrode has a round corner when seen in an opposing direction of the first and second principal surfaces.

5 Claims, 12 Drawing Sheets

(56) References Cited

U.S. PATENT DOCUMENTS

| | | |
|---|---|---|
| 2014/0346924 A1 | 11/2014 | Son et al. |
| 2015/0028723 A1* | 1/2015 | Ikeda .................. H01L 41/0471 |
| | | 310/323.16 |
| 2015/0368162 A1* | 12/2015 | Hayashi ............... B41J 2/14233 |
| | | 252/62.9 PZ |
| 2016/0359098 A1 | 12/2016 | Son et al. |
| 2017/0026028 A1 | 1/2017 | Takase et al. |
| 2017/0173634 A1* | 6/2017 | Hashimoto ............... B06B 1/06 |

FOREIGN PATENT DOCUMENTS

| | | |
|---|---|---|
| JP | 2008-042878 A | 2/2008 |
| JP | 2016-051894 A | 4/2016 |

\* cited by examiner

PIEZOELECTRIC ELEMENT

TECHNICAL FIELD

One aspect of the present invention relates to a piezoelectric element.

BACKGROUND

For example, a piezoelectric element including a plurality of electrode layers and a piezoelectric body layer placed between the electrode layers is described in Japanese Unexamined Patent Publication No. 2016-51894. Each electrode layer includes a main electrode and a connection electrode having different polarities from each other in this piezoelectric element. A main electrode and a connection electrode in electrode layers next to each other are electrically connected to each other by a via that penetrates a piezoelectric body layer. This piezoelectric element is driven when a region placed between main electrodes in a piezoelectric body layer becomes an active region, which is piezoelectrically active, and displacement is generated in the active region.

SUMMARY

In the above-described piezoelectric element, an outer edge of a main electrode becomes a boundary between an active region and an inactive region that is piezoelectrically inactive. Thus, stress associated with displacement in driving is likely to concentrate on the outer edge of the main electrode. Specifically, the main electrode has a corner where two straight lines intersect when seen in a thickness direction of an electrode layer. Thus, stress is likely to concentrate specifically on a corner part in the outer edge of the main electrode. There is a possibility that cracks are generated in a piezoelectric body layer with the corner part being an origin.

One aspect of the present invention is to provide a piezoelectric element that can control cracks in a piezoelectric body layer.

A piezoelectric element according to one aspect of the present invention includes a piezoelectric body layer, a first electrode, a second electrode, a third electrode, and a first through-hole conductor. The piezoelectric body layer has rectangular first and second principal surfaces opposing each other, and includes a piezoelectric material. The first electrode is provided on the first principal surface. The second electrode is provided on the first principal surface in such a way that the second electrode is separated from the first electrode. The third electrode is provided on the second principal surface in such a way that the third electrode opposes the first electrode. The through-hole conductor penetrates the piezoelectric body layer and is connected to the second electrode and the third electrode. The first electrode has a round corner when seen in an opposing direction of the first and second principal surfaces.

In the piezoelectric element according to the one aspect of the present invention, the first electrode has a round corner. Thus, for example, even in a case where an active region is formed between the first electrode and the third electrode and an outer edge of the first electrode becomes a boundary between the active region and an inactive region, it is possible to prevent stress associated with displacement in driving from concentrating on a corner part of the first electrode. Accordingly, it is possible to control cracks in the piezoelectric body layer.

In the piezoelectric element according to the one aspect of the present invention, the second electrode may include a first electrode layer connected to the first through-hole conductor, and a second electrode layer that covers the first electrode layer. An area of the second electrode layer may be larger than an area of the first electrode layer when seen in the opposing direction. In this case, since the second electrode layer can cover the whole first electrode layer, it becomes possible to prevent the first electrode layer from coining off.

In the piezoelectric element according to the one aspect of the present invention, a content rate of a piezoelectric material in the second electrode layer may be lower than a content rate of a piezoelectric material in the first electrode layer. In this case, conductivity of the second electrode layer is higher than conductivity of the first electrode layer. Thus, it is possible to improve conductivity of the first electrode by providing the second electrode layer.

The piezoelectric element according to the one aspect of the present invention may further include a fourth electrode and a second through-hole conductor. The fourth electrode may be provided on the second principal surface in such a way that the fourth electrode is separated from the third electrode. The second through-hole conductor may penetrate the piezoelectric body layer and may be connected to the first electrode and the fourth electrode. The first through-hole conductor may be disposed at a first corner part in the piezoelectric body layer when seen in the opposing direction. When seen in the opposing direction, the second through-hole conductor may be disposed at a second corner part diagonal to the first corner part. When seen in the opposing direction, the first electrode may have a round corner at each of a pair of third corner parts of a piezoelectric body layer which parts are next to the first and second corner parts. In this case, the first and second corner parts are hardly displaced since the first and second through-hole conductors are disposed. Thus, cracks are hardly generated at the first and second corner parts. The first electrode has a round corner at each of the pair of third corner parts. Thus, cracks are also hardly generated at the pair of third corner parts.

In the piezoelectric element according to the one aspect of the present invention, the third electrode may have a round corner. In this case, it is further possible to control cracks in the piezoelectric body layer.

DETAILED DESCRIPTION

An embodiment will be described with reference to the drawings. The following present embodiment is an example for description of the present invention and is not to limit the present invention to the following contents. In the description, the same sign is used for identical elements or elements having identical functions, and overlapped description is omitted.

Figure 1A:
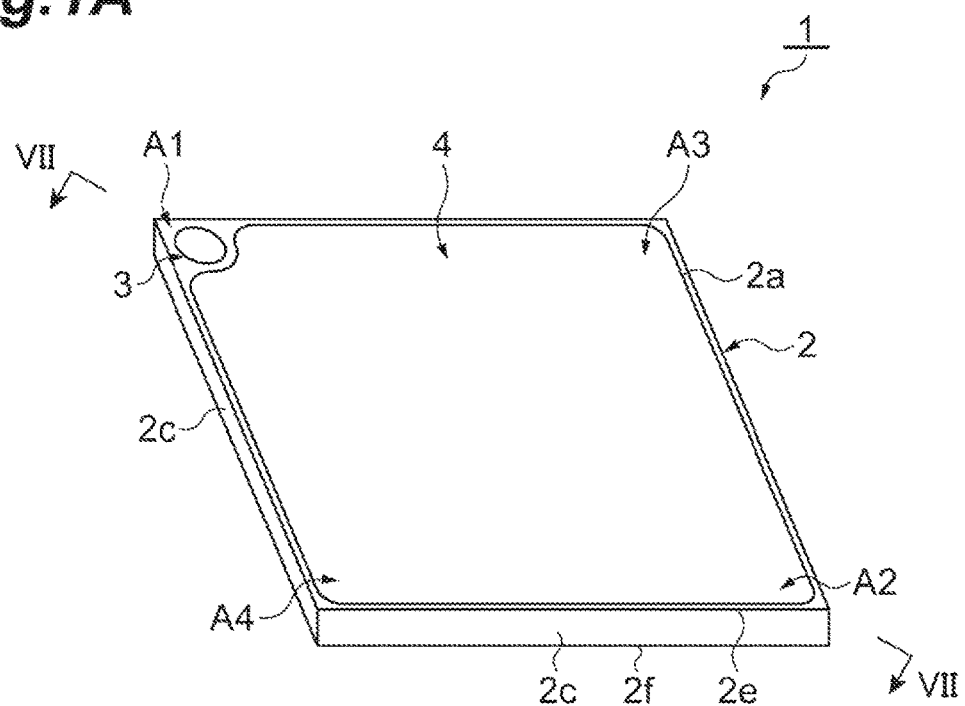
FIG. 1A to FIG. 1C are a perspective view illustrating a piezoelectric element according to an embodiment from an upper side and top views of corner parts.
Figure 1B:
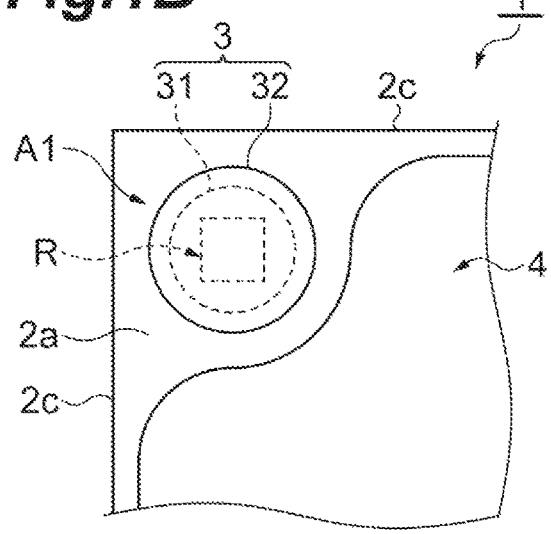
Figure 1C:
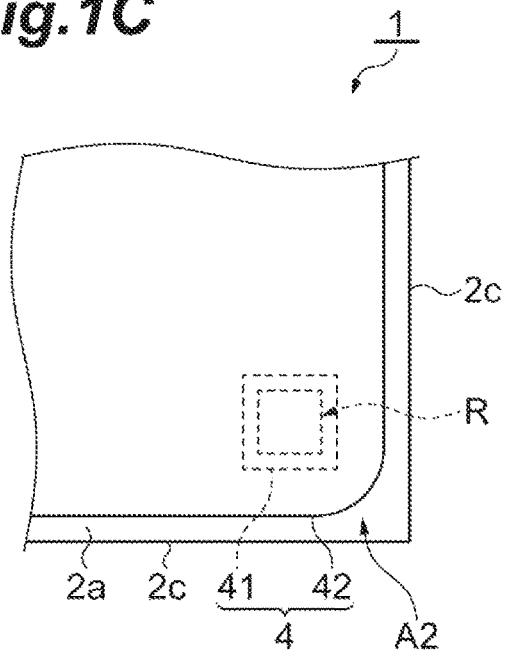
Figure 2A:
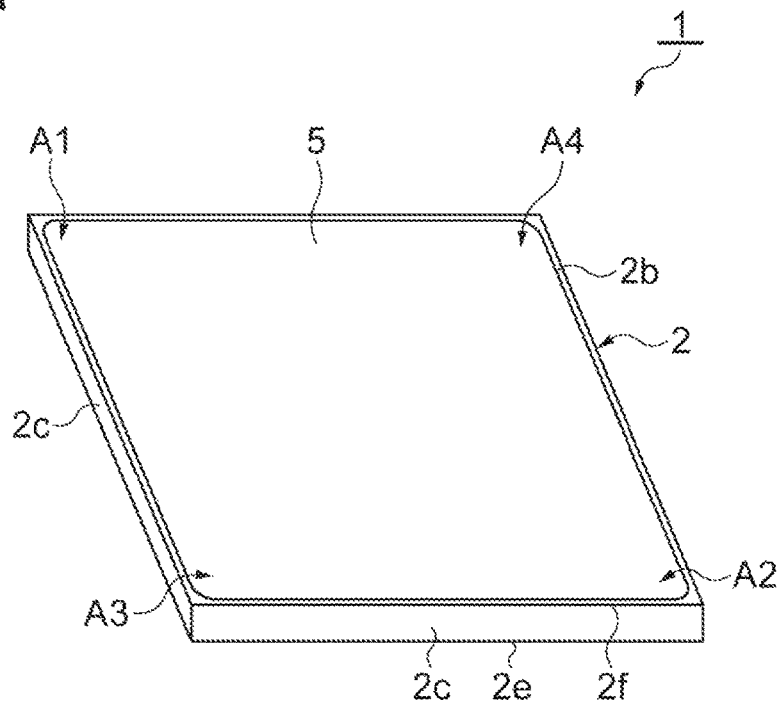
FIG. 2A to FIG. 2C are a perspective view illustrating the piezoelectric element according to the embodiment from a lower side and bottom views of the corner parts.
Figure 2B:
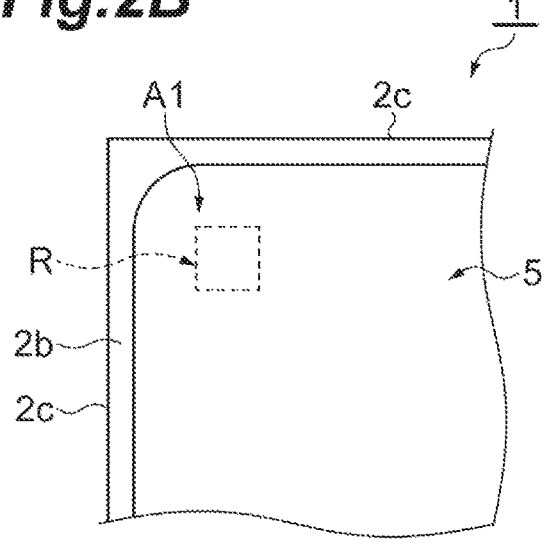
Figure 2C:
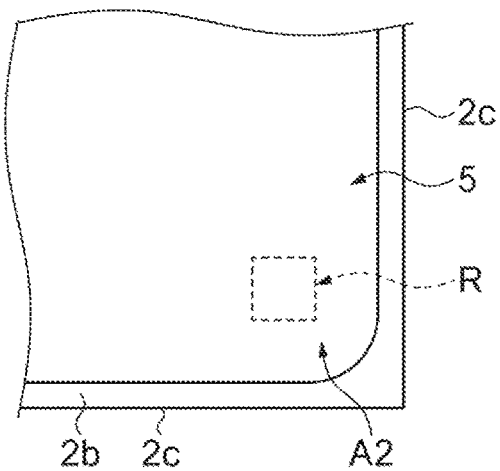
Figure 3:
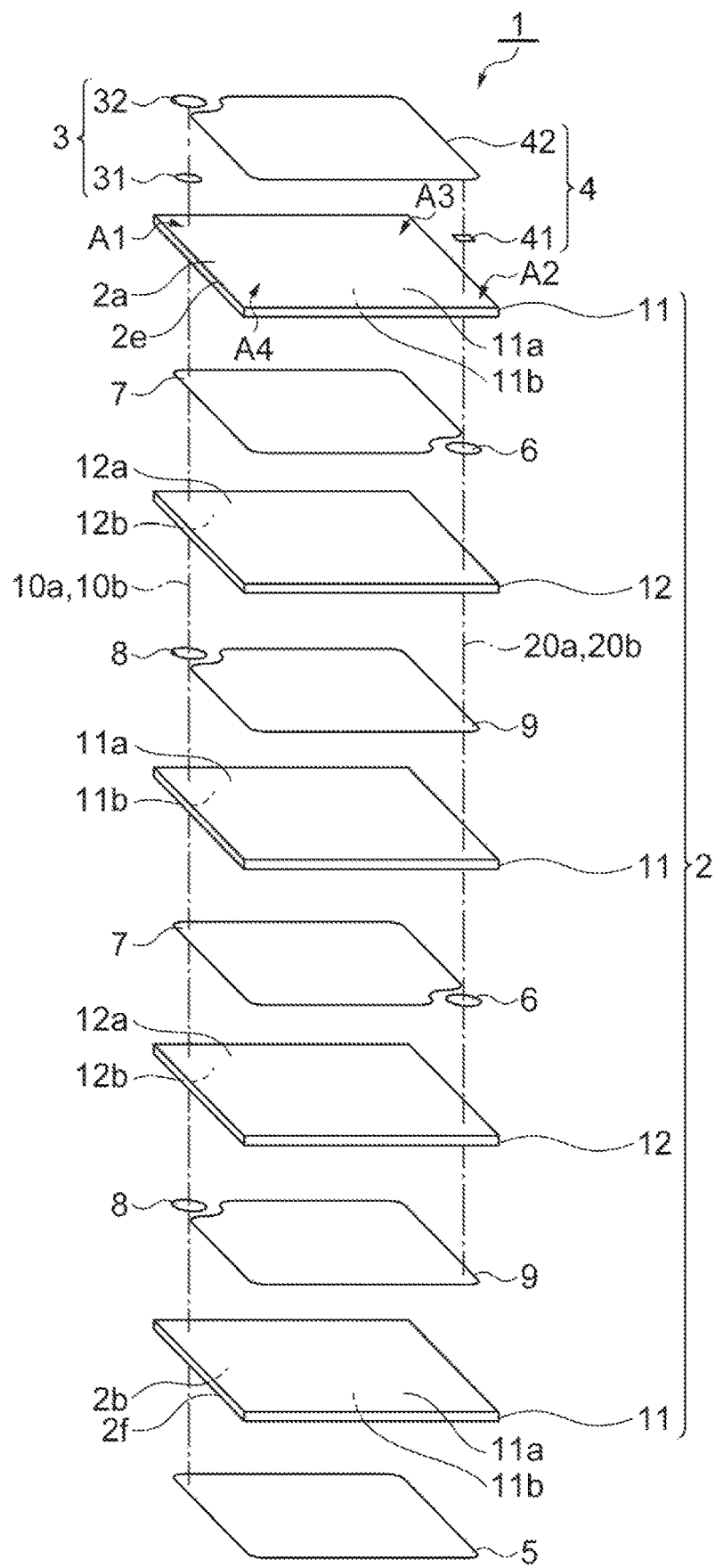
FIG. 3 is an exploded perspective view of the piezoelectric element in FIG. 1A.

FIG. 1A is a perspective view illustrating a piezoelectric element according to the embodiment from an upper side. FIG. 1B is a top view illustrating a corner part A1 in an enlarged manner. FIG. 1C is a top view illustrating a corner part A2 in an enlarged manner. FIG. 2A is a perspective view of illustrating the piezoelectric element according to the embodiment from a lower side. FIG. 2B is a bottom view illustrating the corner part A1 in an enlarged manner. FIG. 2C is a bottom view illustrating the corner part A2 in an enlarged manner. FIG. 3 is an exploded perspective view of the piezoelectric element in FIG. 1A.

As illustrated in FIG. 1A to FIG. 1C, FIG. 2A to FIG. 2C, and FIG. 3, a piezoelectric element 1 includes a piezoelectric element body 2, an external electrode 3, an external electrode 4, an external electrode 5, an inner electrode 6, an inner electrode 7, an inner electrode 8, an inner electrode 9, a plurality of through-hole conductors 10a, a plurality of through-hole conductors 10b, a plurality of through-hole conductors 20a, and a plurality of through-hole conductors 20b. The piezoelectric element 1 is a so-called laminated piezoelectric element.

The piezoelectric element body 2 has a rectangular parallelepiped shape. The piezoelectric element body 2 has a pair of principal surfaces 2a and 2b opposing each other, and four side surfaces 2c. Each of the side surfaces 2c is extended in a direction in which the pair of principal surfaces 2a and 2b opposes each other (hereinafter, referred to as "principal surface opposing direction") in such a way that the pair of principal surfaces 2a and 2b is coupled. The principal surface opposing direction is, for example, a direction orthogonal to each of the principal surfaces 2a and 2b. The rectangular parallelepiped shape includes a rectangular parallelepiped shape in which a corner part and a ridge part are chamfered, and a rectangular parallelepiped shape in which a corner part and a ridge part are rounded.

The piezoelectric element body 2 has four corner parts A1 to A4 when seen in the principal surface opposing direction. The corner part A1 and the corner part A2 are placed diagonally. The corner part A3 and the corner part A4 are placed diagonally. Each of the corner part A3 and the corner part A4 is next to the corner part A1 and the corner part A2. Each of the pair of principal surfaces 2a and 2b has, for example, a rectangular shape. The principal surface 2a has a rectangular outer edge 2e. The principal surface 2b has a rectangular outer edge 2f.

A direction in which the pair of principal surfaces 2a and 2b opposes each other is a thickness direction of the piezoelectric element body 2. A direction in which a pair of side surfaces 2c opposes each other is a length direction of the piezoelectric element body 2. A direction in which the other pair of side surfaces 2c opposes each other is a width direction of the piezoelectric element body 2. A length in the thickness direction of the piezoelectric element body 2 is, for example, 0.1 mm. A length in the length direction of the piezoelectric element body 2 is, for example, 30 mm A length in the width direction of the piezoelectric element body 2 is, for example, 30 mm The piezoelectric element body 2 includes a piezoceramic material (piezoelectric material). As a piezoceramic material, there is PZT [Pb(Zr,Ti)O$_3$], PT (PbTiO$_3$), PLZT [(Pb, La)(Zr,Ti)O$_3$], barium titanate (BaTiO$_3$), bismuth sodium titanate (BNT), potassium sodium niobate (KNN), or the like.

The piezoelectric element body 2 includes a plurality of piezoelectric body layers 11 and 12 alternately laminated in the principal surface opposing direction. The piezoelectric body layers 11 and 12 have the same shape. The piezoelectric body layers 11 and 12 have a rectangular plate-like shape. The piezoelectric element body 2 has, for example, a configuration in which the piezoelectric body layers 12 and 11 are alternately laminated for n times each on the piezoelectric body layer 11. That is, the piezoelectric element body 2 includes the piezoelectric body layer 11 at each end in the principal surface opposing direction. In the present embodiment, n is 2.

The piezoelectric body layer 11 has a pair of principal surfaces 11a and 11b that have, for example, rectangular shapes and that oppose each other. The piezoelectric body layer 12 has a pair of principal surfaces 12a and 12b that have, for example, rectangular shapes and that oppose each other. An opposing direction of the pair of principal surfaces 11a and 11b matches the principal surface opposing direction. An opposing direction of the pair of principal surfaces 12a and 12b matches the principal surface opposing direction. In the piezoelectric element body 2, the principal surface 12a opposes the principal surface 11b, and the principal surface 12b opposes the principal surface 11a. Each of the piezoelectric body layers 11 and 12 has four corner parts corresponding to the four corner parts A1 to A4.

The principal surface 2a of the piezoelectric element body 2 includes a principal surface 11a of a piezoelectric body layer 11 disposed at one end in the principal surface opposing direction (hereinafter, also referred to as "piezoelectric body layer 11 at one end") among the plurality of piezoelectric body layers 11. The principal surface 2b of the piezoelectric element body 2 includes a principal surface 11b of a piezoelectric body layer 11 disposed at the other end in the principal surface opposing direction (hereinafter, also referred to as "piezoelectric body layer 11 at the other end") among the plurality of piezoelectric body layers 11. Each of the piezoelectric body layers 11 and 12 includes, for example, a sintered body of a ceramic green sheet including the above-described piezoceramic material. In an actual piezoelectric element body 2, piezoelectric body layers 11 and 12 are integrated in such a way that no boundary can be visually recognized between the piezoelectric body layers 11 and 12.

The plurality of piezoelectric body layers 11 and 12 are alternately laminated between the external electrodes 3 to 5 via the inner electrodes 6 to 9. More specifically, in the principal surface opposing direction, the external electrodes 3 and 4, the piezoelectric body layer 11 at one end, the inner electrodes 6 and 7, the piezoelectric body layer 12, the inner electrodes 8 and 9, a piezoelectric body layer 11 disposed between the piezoelectric body layer 11 at one end and the piezoelectric body layer 11 at the other end (hereinafter, also referred to as "piezoelectric body layer 11 in the middle"), the inner electrodes 6 and 7, the piezoelectric body layer 12, the inner electrodes 8 and 9, the piezoelectric body layer 11 at the other end, and the external electrode 5 are disposed side by side in this order.

The piezoelectric body layer 11 at one end is disposed between the external electrodes 3 and 4 and the inner electrodes 6 and 7. The external electrodes 3 and 4 are provided on the principal surface 11a of the piezoelectric body layer 11 at one end. The inner electrodes 6 and 7 are provided on a principal surface 11b of the piezoelectric body layer 11 at one end. The piezoelectric body layer 11 in the middle is disposed between the inner electrodes 8 and 9 and the inner electrodes 6 and 7. The inner electrodes 8 and 9 are provided on a principal surface 11a of the piezoelectric body layer 11 in the middle. The inner electrodes 6 and 7 are provided on a principal surface 11b of the piezoelectric body layer 11 in the middle. The piezoelectric body layer 11 at the other end is disposed between the inner electrodes 8 and 9 and the external electrode 5. The inner electrodes 8 and 9 are provided on a principal surface 11a of the piezoelectric body layer 11 at the other end. The external electrode 5 is provided on the principal surface 11b of the piezoelectric body layer 11 at the other end. Each piezoelectric body layer 12 is disposed between the inner electrodes 6 and 7 and the inner electrodes 8 and 9. The inner electrodes 6 and 7 are provided on a principal surface 12a of each piezoelectric body layer 12. The inner electrodes 8 and 9 are provided on a principal surface 12b of each piezoelectric body layer 12.

The piezoelectric body layer 11 at one end and a piezoelectric body layer 12 oppose each other via the inner electrodes 6 and 7. The piezoelectric body layer 12 and the piezoelectric body layer 11 in the middle oppose each other via the inner electrodes 8 and 9. The piezoelectric body layer 11 in the middle and a piezoelectric body layer 12 oppose each other via the inner electrodes 6 and 7. The piezoelectric body layer 12 and the piezoelectric body layer 11 at the other end oppose each other via the inner electrodes 8 and 9. In other words, the external electrodes 3 and 4 and the inner electrodes 6 and 7 oppose each other via the piezoelectric body layer 11 at one end. The inner electrodes 6 and 7 and the inner electrodes 8 and 9 oppose each other via each piezoelectric body layer 12. The inner electrodes 8 and 9 and the external electrode 5 oppose each other via the piezoelectric body layer 11 at the other end. An opposing direction of these electrodes matches the principal surface opposing direction.

The external electrode 3 is provided on the principal surface 2a (that is, principal surface 11a). The external electrode 4 is provided on the principal surface 2a in such a way that the external electrode 4 is separated from the external electrode 3. The external electrodes 3 and 4 are separated from the outer edge 2e of the principal surface 2a when seen in the principal surface opposing direction. A distance of separation between the external electrodes 3 and 4 and the outer edge 2e is 20 µm or longer.

The external electrode 3 is provided at the corner part A1. The external electrode 3 includes an electrode layer 31 connected to a plurality of through-hole conductors 10a, and an electrode layer 32 that covers the electrode layer 31. The electrode layer 31 has a circular shape when seen in the principal surface opposing direction. The electrode layer 32 has a circular shape concentric with the electrode layer 31 when seen in the principal surface opposing direction. An area of the electrode layer 32 is larger than an area of the electrode layer 31 when seen in the principal surface opposing direction. The electrode layer 32 covers the whole electrode layer 31. The electrode layer 32 has a part overlapped with the electrode layer 31, and a part that is placed on an outer side of the electrode layer 31 and that is in contact with the principal surface 2a when seen in the principal surface opposing direction.

The external electrode 4 includes an electrode layer 41 connected to a plurality of through-hole conductors 20a, and an electrode layer 42 that covers the electrode layer 41. The electrode layer 41 has a rectangular shape when seen in the principal surface opposing direction. The electrode layer 41 is provided at the corner part A2. When seen in the principal surface opposing direction, the electrode layer 42 is provided in a region in which a separation region between the external electrodes 3 and 4 and the outer edge 2e and a disposed region of the external electrode 3 are excluded from the rectangular piezoelectric element body 2.

The electrode layer 42 has a round corner at each of the corner parts A1 to A4 when seen in the principal surface opposing direction. Here, the round corner does not mean a corner where two straight lines intersect but means a curved corner where end parts of two straight lines are connected to each other with a curved line. When seen in the principal surface opposing direction, a round corner of the electrode layer 42 is a curved corner where end parts of two straight lines of an outer edge of the electrode layer 42 along the outer edge 2e are connected to each other with a curved line. An area of the electrode layer 42 is larger than an area of the electrode layer 41 when seen in the principal surface opposing direction. The electrode layer 42 covers the whole electrode layer 41. The electrode layer 42 has a part overlapped with the electrode layer 41, and a part that is placed on an outer side of the electrode layer 41 and that is in contact with the principal surface 2a when seen in the principal surface opposing direction.

The external electrode 5 is provided on the principal surface 2b. The external electrode 5 is separated from the outer edge 2f of the principal surface 2b when seen in the principal surface opposing direction. A distance of separation between the external electrode 5 and the outer edge 2f is 20 µm or longer. When seen in the principal surface opposing direction, the external electrode 5 is provided in a region in which a separation region between the external electrode 5 and the outer edge 2f is excluded from the rectangular piezoelectric element body 2. The external electrode 5 has a round corner at each of the corner parts A1 to A4 when seen in the principal surface opposing direction. When seen in the principal surface opposing direction, a round corner of the external electrode 5 is a curved corner at which end parts of two straight lines along the outer edge 2f are connected to each other with a curved line in an outer edge of the external electrode 5.

Figure 4:
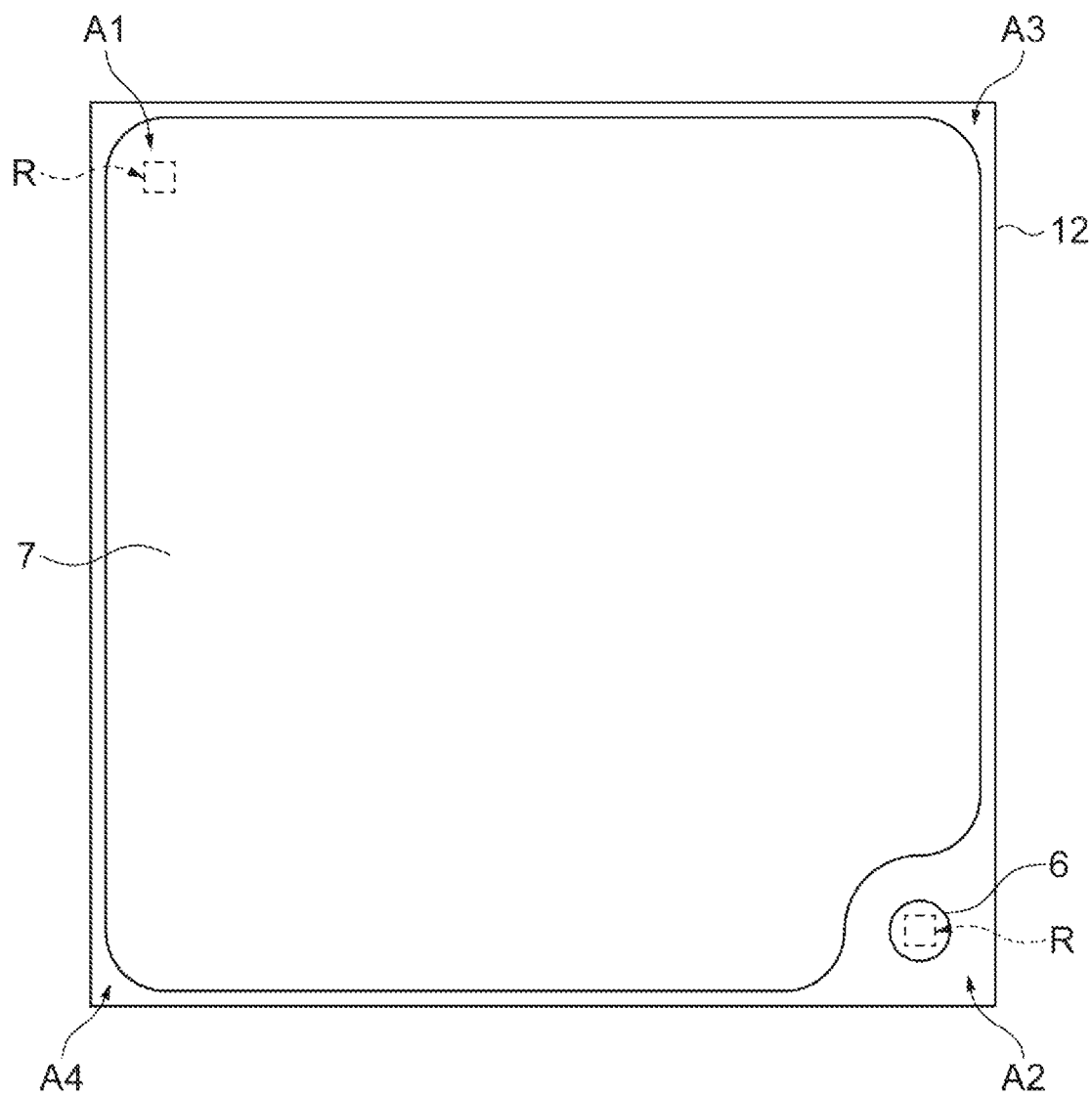
FIG. 4 is a view for describing an inner electrode illustrated in FIG. 3.
Figure 5:
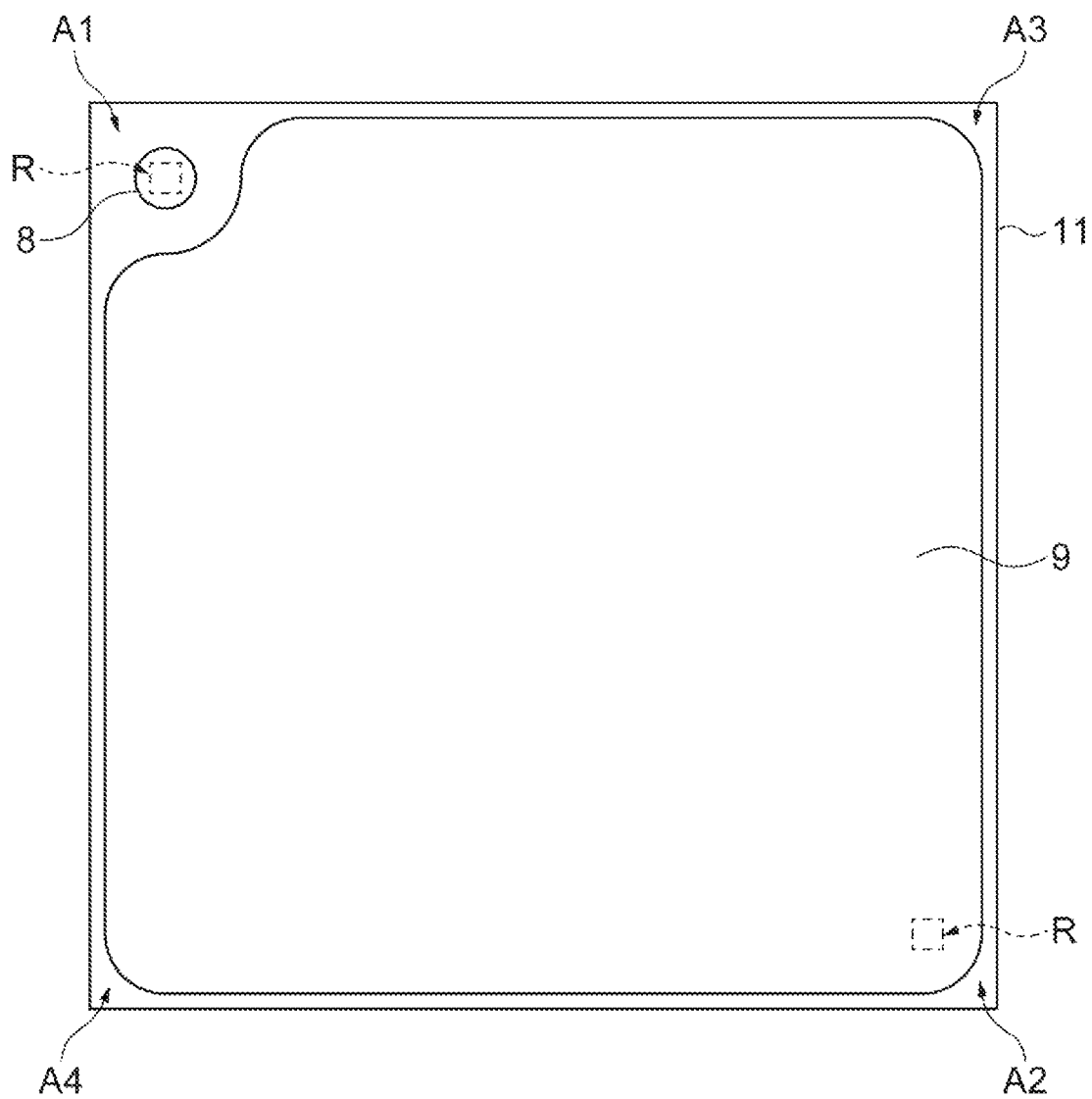
FIG. 5 is a view for describing an inner electrode illustrated in FIG. 3.

FIG. 4 and FIG. 5 are views for describing an inner electrode illustrated in FIG. 3. FIG. 4 is a view for describing the inner electrodes 6 and 7. In FIG. 4, the piezoelectric body layer 12, and the inner electrodes 6 and 7 are illustrated. FIG. 5 is a view for describing the inner electrodes 8 and 9. In FIG. 5, the piezoelectric body layer 11 in the middle, and the inner electrodes 8 and 9 are illustrated.

As illustrated in FIG. 1A to FIG. 5, the inner electrodes 6 and 7 are separated from each other when seen in the principal surface opposing direction. The inner electrodes 6 and 7 are separated from each of the side surfaces 2c when seen in the principal surface opposing direction. In other words, the inner electrodes 6 and 7 are separated from any of outer edges of the principal surfaces 11b and 12a on which the inner electrodes 6 and 7 are provided. A distance of separation between the inner electrodes 6 and 7 and each of the side surfaces 2c is 20 µm or longer.

The inner electrode 6 has a circular shape when seen in the principal surface opposing direction. The inner electrode 6 is provided at the corner part A2. When seen in the principal surface opposing direction, the inner electrode 7 is provided in a region in which a separation region between the inner electrodes 6 and 7 and each of the side surfaces 2c and a disposed region of the inner electrode 6 are excluded from the rectangular piezoelectric element body 2. The inner electrode 7 has a round corner at each of the corner parts A1 to A4 when seen in the principal surface opposing direction. When seen in the principal surface opposing direction, a round corner of the inner electrode 7 is a curved corner at which end parts of two straight lines along the side surfaces 2c are connected to each other with a curved line in the outer edge of the inner electrode 7.

The inner electrodes 8 and 9 are separated from each other when seen in the principal surface opposing direction. The inner electrodes 8 and 9 are separated from each of the side surfaces 2c when seen in the principal surface opposing direction. In other words, the inner electrodes 8 and 9 are separated from any of outer edges of the principal surfaces 11a and 12b on which the inner electrodes 8 and 9 are provided. A distance of separation between the inner electrodes 8 and 9 and each of the side surfaces 2c is 20 μm or longer.

The inner electrode 8 has a circular shape when seen in the principal surface opposing direction. The inner electrode 8 is overlapped with the corner part A1 when seen in the principal surface opposing direction. The inner electrode 9 has a shape identical with that of the electrode layer 41 and matches the electrode layer 41 in the principal surface opposing direction. When seen in the principal surface opposing direction, the inner electrode 9 is provided in a region in which a separation region between the inner electrodes 8 and 9 and each of the side surfaces 2c and a disposed region of the inner electrode 8 are excluded from the piezoelectric element body 2. The inner electrode 9 has a round corner at each of the corner parts A1 to A4 when seen in the principal surface opposing direction. When seen in the principal surface opposing direction, a round corner of the inner electrode 9 is a curved corner at which end parts of two straight lines along the side surfaces 2c are connected to each other with a curved line in the outer edge of the inner electrode 9.

As described above, since each of the principal surfaces 11a, 11b, 12a, and 12b of the present embodiment has a rectangular shape, a corner where two straight lines intersect. That is, a shape of a corner of each of the principal surfaces 11a, 11b, 12a, and 12b is different from a shape of a corner of each of the electrode layer 42, the external electrode 5, and the inner electrodes 7 and 9.

Figure 6:
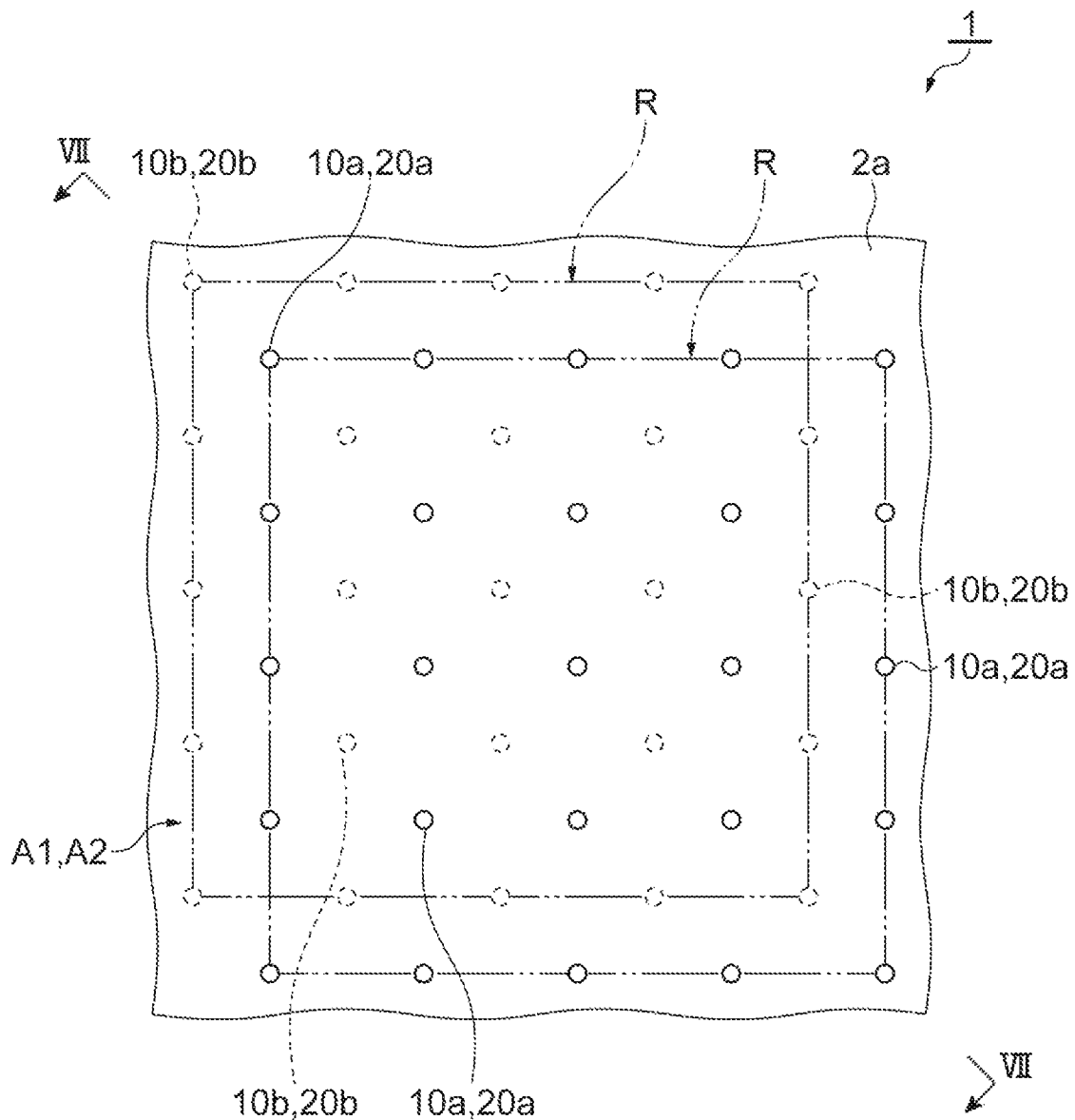
FIG. 6 is a plan view illustrating a part of the piezoelectric element in FIG. 1A in an enlarged manner.
Figure 7:
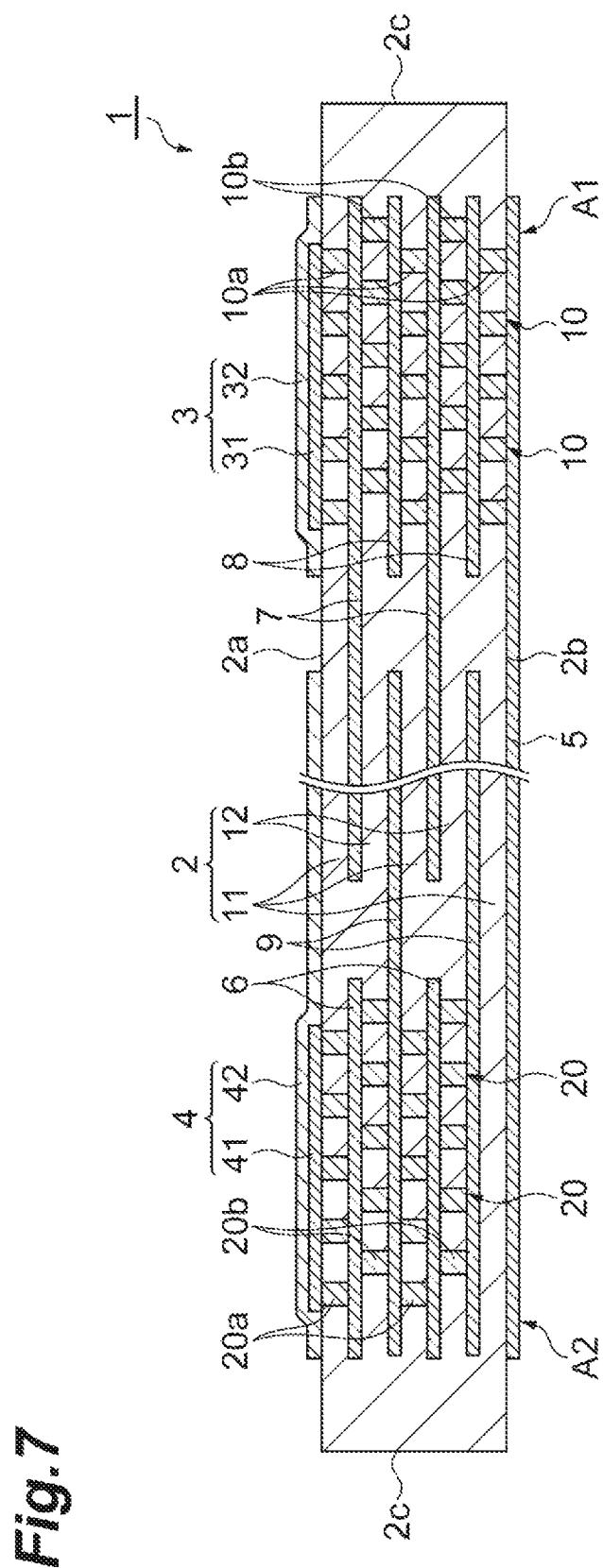
FIG. 7 is a VII-VII sectional view of FIG. 1A and FIG. 6.

FIG. 6 is a plan view illustrating a part of the piezoelectric element in FIG. 1A in an enlarged manner In FIG. 6, illustration of the external electrodes 3 and 4 provided on the principal surface 2a is omitted. FIG. 7 is a VII-VII sectional view of FIG. 1A and FIG. 6. As illustrated in FIG. 3, FIG. 6, and FIG. 7, the plurality of through-hole conductors 10a and 10b, and the plurality of through-hole conductors 20a and 20b are disposed in such a way as to be separated from each other when seen in the principal surface opposing direction. The plurality of through-hole conductors 10a and 10b is disposed at the corner part A1. The plurality of through-hole conductors 20a and 20b is disposed at the corner part A2.

The plurality of through-hole conductors 10a penetrates each piezoelectric body layer 11. The plurality of through-hole conductors 10a is disposed in such a way that the plurality of through-hole conductors 10a is overlapped with each other when seen in the principal surface opposing direction. The plurality of through-hole conductors 10b penetrates each piezoelectric body layer 12. The plurality of through-hole conductors 10b is disposed in such a way that the plurality of through-hole conductors 10b is overlapped with each other when seen in the principal surface opposing direction. The plurality of through-hole conductors 10a and the plurality of through-hole conductors 10b are disposed in such a way as to be separated from each other when seen in the principal surface opposing direction.

The plurality of through-hole conductors 10a penetrating the piezoelectric body layer 11 at one end is physically and electrically connected to the electrode layer 31 and the inner electrode 7. The plurality of through-hole conductors 10a penetrating the piezoelectric body layer 11 in the middle is physically and electrically connected to the inner electrode 7 and the inner electrode 8. The plurality of through-hole conductors 10a penetrating the piezoelectric body layer 11 at the other end is physically and electrically connected to the external electrode 5 and the inner electrode 8. The plurality of through-hole conductors 10b penetrating each piezoelectric body layer 12 is physically and electrically connected to the inner electrode 7 and the inner electrode 8. The plurality of through-hole conductors 10a and the plurality of through-hole conductors 10b are electrically connected to each other by the inner electrode 7 or the inner electrode 8.

The plurality of through-hole conductors 20a penetrates each piezoelectric body layer 11. The plurality of through-hole conductors 20a is disposed in such a way that the plurality of through-hole conductors 20a is overlapped with each other when seen in the principal surface opposing direction. The plurality of through-hole conductors 20b penetrates each piezoelectric body layer 12. The plurality of through-hole conductors 20b is disposed in such a way that the plurality of through-hole conductors 20b is overlapped with each other when seen in the principal surface opposing direction. The plurality of through-hole conductors 20a and the plurality of through-hole conductors 20b are disposed in such a way as to be separated from each other when seen in the principal surface opposing direction.

The plurality of through-hole conductors 20a penetrating the piezoelectric body layer 11 at one end is physically and electrically connected to the electrode layer 41 and the inner electrode 6. The plurality of through-hole conductors 20a penetrating the piezoelectric body layer 11 in the middle is physically and electrically connected to the inner electrode 6 and the inner electrode 9. The plurality of through-hole conductors 20b penetrating each piezoelectric body layer 12 is physically and electrically connected to the inner electrode 6 and the inner electrode 9. The plurality of through-hole conductors 20a and the plurality of through-hole conductors 20b are electrically connected to each other by the inner electrode 6 or the inner electrode 9.

The plurality of through-hole conductors 10a is arrayed in a matrix when seen in the principal surface opposing direction. The plurality of through-hole conductors 10a is arrayed, for example, at equal distances when seen in the principal surface opposing direction. The plurality of through-hole conductors 10a is disposed at intersection positions of a lattice at equal distances (that is, square lattice). The plurality of through-hole conductors 10b is arrayed in a matrix when seen in the principal surface opposing direction. The plurality of through-hole conductors 10b is arrayed, for example, at equal distances when seen in the principal surface opposing direction. The plurality of through-hole conductors 10b is disposed at intersection positions of a lattice at equal distances (that is, square lattice).

An array distance of the plurality of through-hole conductors 10a is equal to an array distance of the plurality of through-hole conductors 10b. As described above, the plurality of through-hole conductors 10a and the plurality of through-hole conductors 10b are disposed in such a way as to be separated from each other when seen in the principal surface opposing direction. The plurality of through-hole conductors 10a is disposed at positions moved in parallel for ½ of an array distance in a row direction and a column direction from the plurality of through-hole conductors 10b when seen in the principal surface opposing direction.

The plurality of through-hole conductors 20a is arrayed in a matrix when seen in the principal surface opposing direction. The plurality of through-hole conductors 20a is arrayed, for example, at equal distances when seen in the principal surface opposing direction. The plurality of through-hole conductors 20a is disposed at intersection positions of a lattice at equal distances (that is, square lattice). The plurality of through-hole conductors 20b is arrayed in a matrix when seen in the principal surface opposing direction. The plurality of through-hole conductors 20b is arrayed, for example, at equal distances when seen in the principal surface opposing direction. The plurality of through-hole conductors 20b is disposed at intersection positions of a lattice at equal distances (that is, square lattice).

An array distance of the plurality of through-hole conductors 20a is equal to an array distance of the plurality of through-hole conductors 20b. As described above, the plurality of through-hole conductors 20a and the plurality of through-hole conductors 20b are disposed in such a way as to be separated from each other when seen in the principal surface opposing direction. The plurality of through-hole conductors 20a is disposed at positions moved in parallel for ½ of an array distance in a row direction and a column direction from the plurality of through-hole conductors 20b when seen in the principal surface opposing direction. In the present embodiment, an array distance of the plurality of through-hole conductors 10a, an array distance of the plurality of through-hole conductors 10b, an array distance of the plurality of through-hole conductors 20a, and an array distance of the plurality of through-hole conductors 20b are equal to each other.

A region R demarcated by the plurality of through-hole conductors 10a has an n-gon shape (n is integer number equal to or larger than 4) when seen in the principal surface opposing direction. Here, when seen in the principal surface opposing direction, the region R has, for example, a polygonal shape in which through-hole conductors 10a placed at ends of an array among the plurality of through-hole conductors 10a (that is, through-hole conductor 10a placed at each end in each row, and through-hole conductor 10a placed at each end in each column) are connected with a straight line. That is, the region R has a columnar shape with this polygonal shape as a bottom surface.

In the present embodiment, 25 through-hole conductors 10a are arrayed in a matrix of 5×5 (that is, five row and five column). The region R has a quadrangle shape (more specifically, square shape) when seen in the principal surface opposing direction. That is, the region R has a quadrangular prism shape (more specifically, tetragonal prism shape). Each of the plurality of through-hole conductors 10b, the plurality of through-hole conductors 20a, and the plurality of through-hole conductors 20b demarcates a region R in a way similar to that by the plurality of through-hole conductors 10a.

Each of the external electrodes 3 to 5, the inner electrodes 6 to 9, and the plurality of through-hole conductors 10a, 10b, 20a, and 20b includes, for example, Ag, Pd, or Cu and is a conductor. These conductors are formed as sintered bodies of a conductive paste including a conductive material. The electrode layer 31 in the external electrode 3, the electrode layer 41 in the external electrode 4, the inner electrodes 6 to 9, and the plurality of through-hole conductors 10a, 10b, 20a, and 20b include, as a common material, a piezoelectric material included in the piezoelectric element body 2 in order to bring a contraction rate in burning closer to that of the piezoelectric element body 2. The electrode layer 32 in the external electrode 3 and the electrode layer 42 in the external electrode 4 do not include this piezoelectric material. That is, a content rate of a piezoelectric material in the electrode layers 32 and 42 is lower than a content rate of a piezoelectric material in the electrode layers 31 and 41. Thus, conductivity of the electrode layers 32 and 42 is higher than conductivity of the electrode layers 31 and 41.

Figure 8:
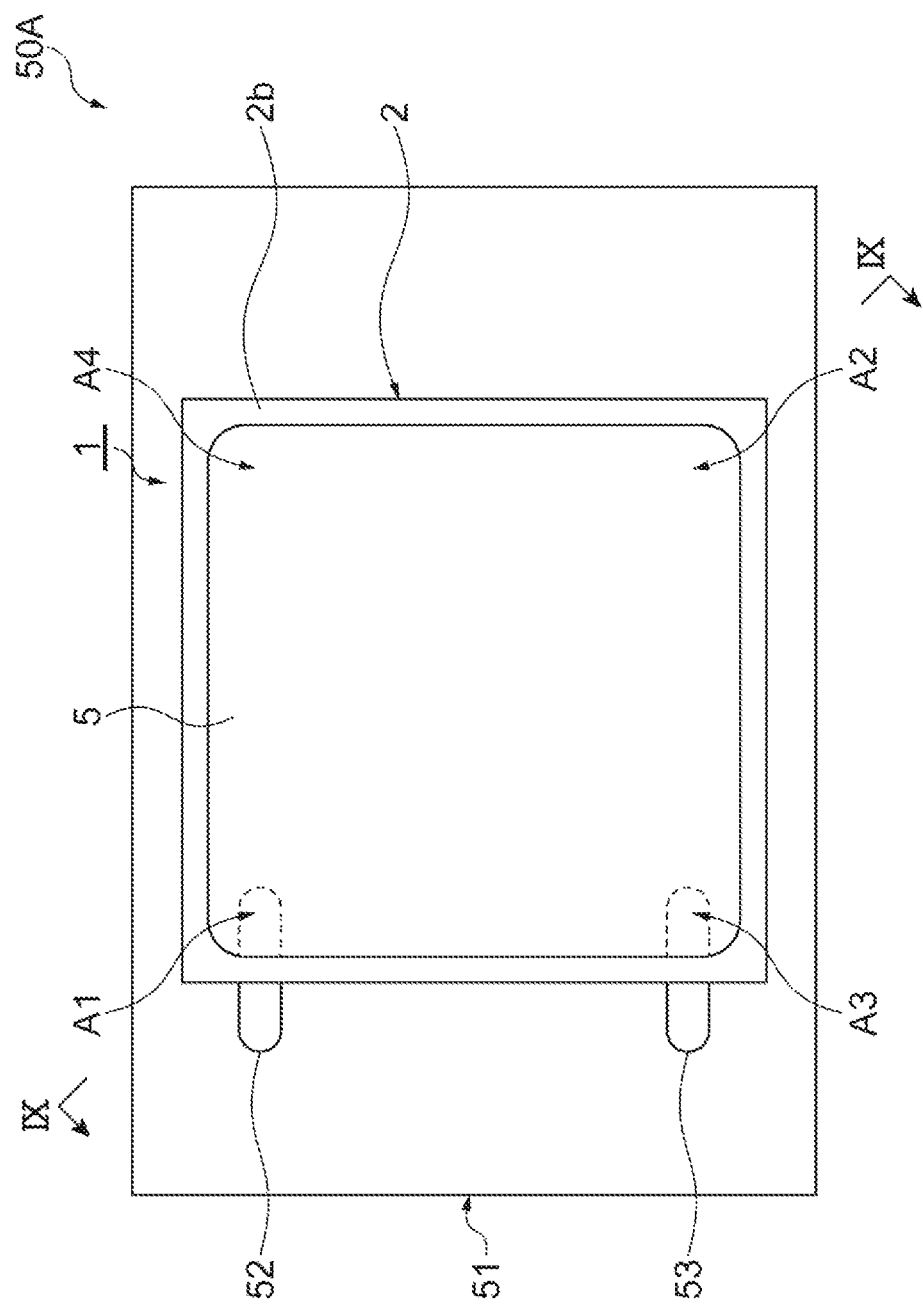
FIG. 8 is a plan view of an electronic device including the piezoelectric element in FIG. 1A.
Figure 9:
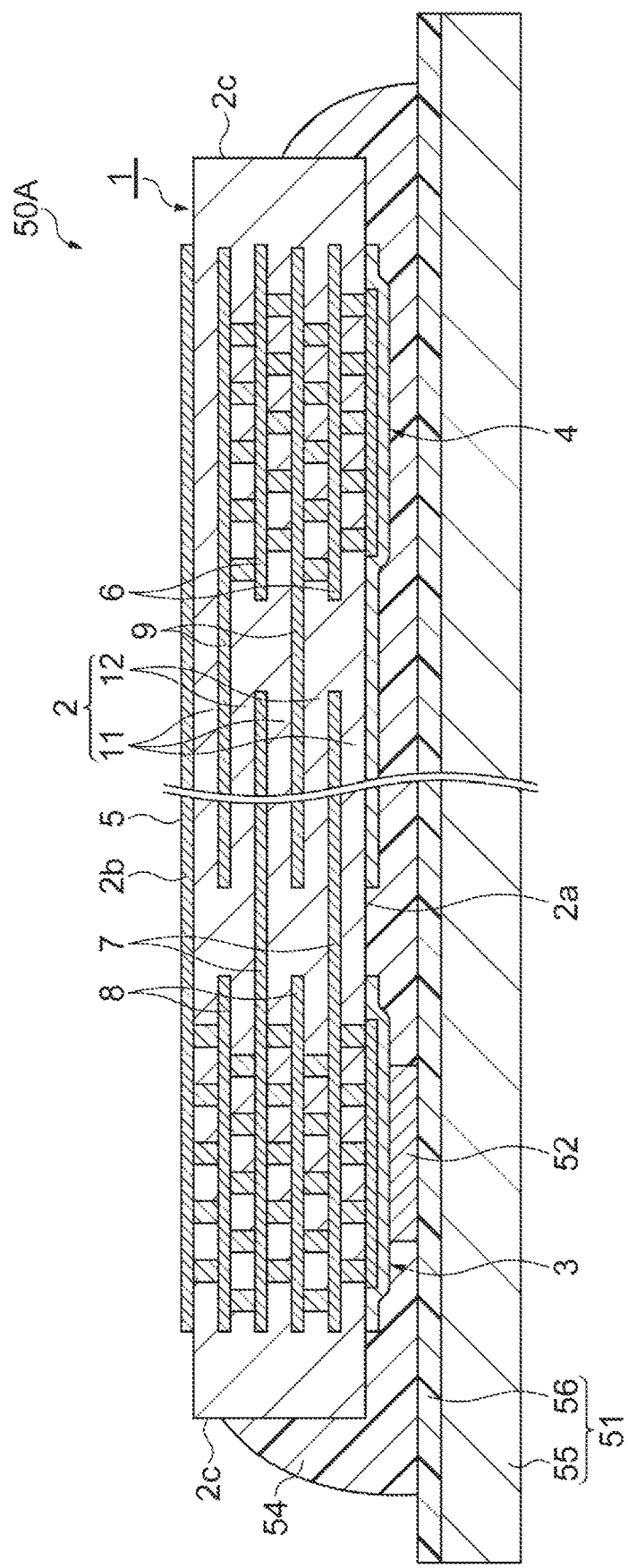
FIG. 9 is a IX-IX sectional view of FIG. 8.

FIG. 8 is a plan view of an electronic device including the piezoelectric element in FIG. 1A. FIG. 9 is a IX-IX sectional view of FIG. 8. An electronic device 50A illustrated in FIG. 8 and FIG. 9 is, for example, a vibration device. The electronic device 50A includes a piezoelectric element 1, a vibrating body 51, extraction electrodes 52 and 53, and an adhesive member 54.

The vibrating body 51 includes a metal plate 55, and an insulation layer 56 disposed on the metal plate 55. The vibrating body 51 is, for example, a rectangular plate-like member when seen in a principal surface opposing direction. The vibrating body 51 is disposed in such a way that the metal plate 55 and a principal surface 2a of the piezoelectric element 1 oppose each other via the insulation layer 56. The metal plate 55 includes, for example, Ni, stainless steel, brass, or an inver material (Ni—Mn—Fe). The insulation layer 56 is, for example, a polyimide resin or an epoxy resin. The insulation layer 56 covers the whole of one principal surface of the metal plate 55. A thickness of the insulation layer 56 is, for example, 5 µm.

The extraction electrodes 52 and 53 include, for example, Au, Sn, or Ni. The extraction electrodes 52 and 53 are disposed on the insulation layer 56 in such a way as to be separated from each other. The extraction electrode 52 is physically and electrically connected to an external electrode 3. The extraction electrode 53 is physically and electrically connected to an external electrode 4. The adhesive member 54 is, for example, an epoxy resin or an acrylic resin. The adhesive member 54 fixes the piezoelectric element 1 to the vibrating body 51 by joining the piezoelectric element 1 and the vibrating body 51.

For example, when voltage with different polarities is applied to the external electrodes 3 and 4 via the extraction electrodes 52 and 53, an electric field is generated between the external electrode 4, an inner electrode 7, an inner electrode 9, and an external electrode 5 in the electronic device 50A. Accordingly, a region sandwiched by the external electrode 4 and the inner electrode 7 in the piezoelectric body layer 11 at one end, a region sandwiched by the inner electrode 7 and the inner electrode 9 in the piezoelectric body layer 11 in the middle, a region sandwiched by the external electrode 5 and the inner electrode 9 in the piezoelectric body layer 11 at the other end, a region sandwiched by the inner electrode 7 and the inner electrode 9 in a piezoelectric body layer 12 become active regions that are piezoelectrically active, and displacement is generated in the active regions. In a case where the applied voltage is an AC voltage, the piezoelectric element 1 repeats expansion and contraction according to a frequency of the AC voltage. The piezoelectric element 1 and the vibrating body 51 are joined to each other by the adhesive member 54. Thus, the vibrating body 51 integrally deflects and vibrates with the piezoelectric element 1 in response to repetition of expansion and contraction in the piezoelectric element 1.

Figure 10:
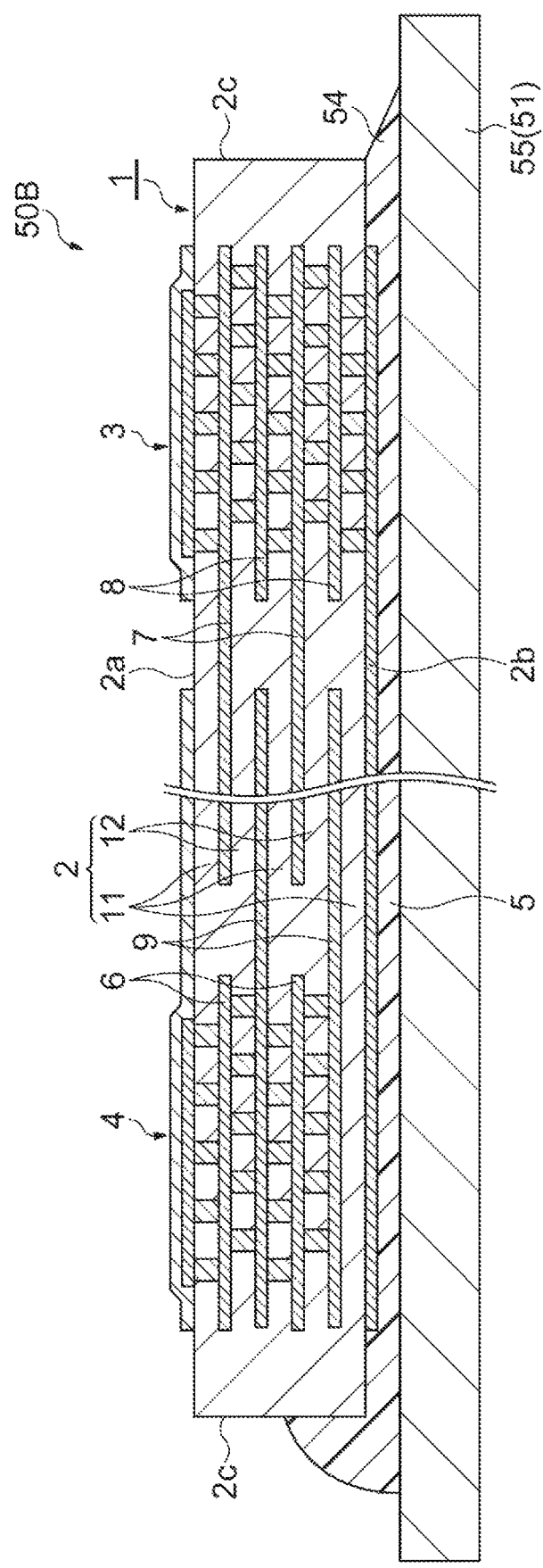
FIG. 10 is a sectional view of an electronic device according to a modification example.

FIG. 10 is a sectional view of an electronic device according to a modification example. An electronic device 50B illustrated in FIG. 10 is different from the electronic device 50A mainly in that extraction electrodes 52 and 53 are not included. In the electronic device 50B, a vibrating body 51 does not include an insulation layer 56. A metal plate 55 configures the vibrating body 51. A principal surface 2b of a piezoelectric element 1 opposes the vibrating body 51. The piezoelectric element 1 is fixed to the vibrating body 51 by an adhesive member 54 in a state in which a principal surface 2a is exposed. The adhesive member 54 includes a conductive filler and electrically connects an external electrode 5 and the metal plate 55. For example, in the electronic device 50B, it is possible to connect a lead wire to an external electrode 4 and to apply voltage to the external electrode 4 via the lead wire. For example, it is possible to apply voltage to the external electrode 5 via the metal plate 55. When voltage with different polarities is applied to the external electrodes 4 and 5, the electronic device 50B is driven in a way similar to that of the electronic device 50A and the vibrating body 51 performs deflection vibration.

As described above, the external electrodes 4 and 5 and the inner electrodes 7 and 9 have round corners in the piezoelectric element 1 according to the present embodiment. In the piezoelectric element 1, an active region is formed between these electrodes and an outer edge of each electrode becomes a boundary between the active region and an inactive region. Even in such a case, with a round corner, it becomes possible to prevent stress associated with displacement in driving from concentrating on a corner part of each electrode. Accordingly, it is possible to control cracks in the piezoelectric body layer.

The external electrode 3 includes the electrode layer 31 connected to the through-hole conductors 10a, and the electrode layer 32 that covers the electrode layer 31. When seen in the principal surface opposing direction, an area of the electrode layer 32 is larger than an area of the electrode layer 31. The electrode layer 32 covers the whole electrode layer 31. Thus, it is possible to prevent the electrode layer 31 from coining off.

A content rate of a piezoelectric material in the electrode layers 32 and 42 is lower than a content rate of a piezoelectric material in the electrode layers 31 and 41. Thus, conductivity of the electrode layers 32 and 42 is higher than conductivity of the electrode layers 31 and 41. Thus, it is possible to improve conductivity of the external electrodes 3 and 4 by providing the electrode layers 32 and 42. Since a thickness of the external electrodes 3 and 4 (length in the principal surface opposing direction) is increased when the electrode layers 32 and 42 are provided, it is possible to prevent solder from dissolving the external electrodes 3 and 4.

In the piezoelectric element body 2, the corner part A1 is hardly displaced since the through-hole conductors 10a and 10b are provided, and the corner part A2 is hardly displaced since the through-hole conductors 20a and 20b are provided. Thus, cracks are hardly generated at these parts. The external electrodes 4 and 5 and the inner electrodes 7 and 9 have round corners at the corner parts A3 and A4. Thus, cracks are also hardly generated at these parts.

Voltage with different polarities is applied to the external electrodes 3 and 4 in the piezoelectric element 1. The through-hole conductors 10a and 10b electrically connected to the external electrode 3, and the through-hole conductors 20a and 20b electrically connected to the external electrode 4 are disposed at the diagonally-placed corner parts A1 and A2. Accordingly, the through-hole conductors 10a and 10b, and the through-hole conductors 20a and 20b are adequately separated, and generation of a short circuit is controlled.

The present invention is not necessarily limited to the above-described embodiments, and various modifications can be made with the spirit and the scope thereof.

Figure 11:
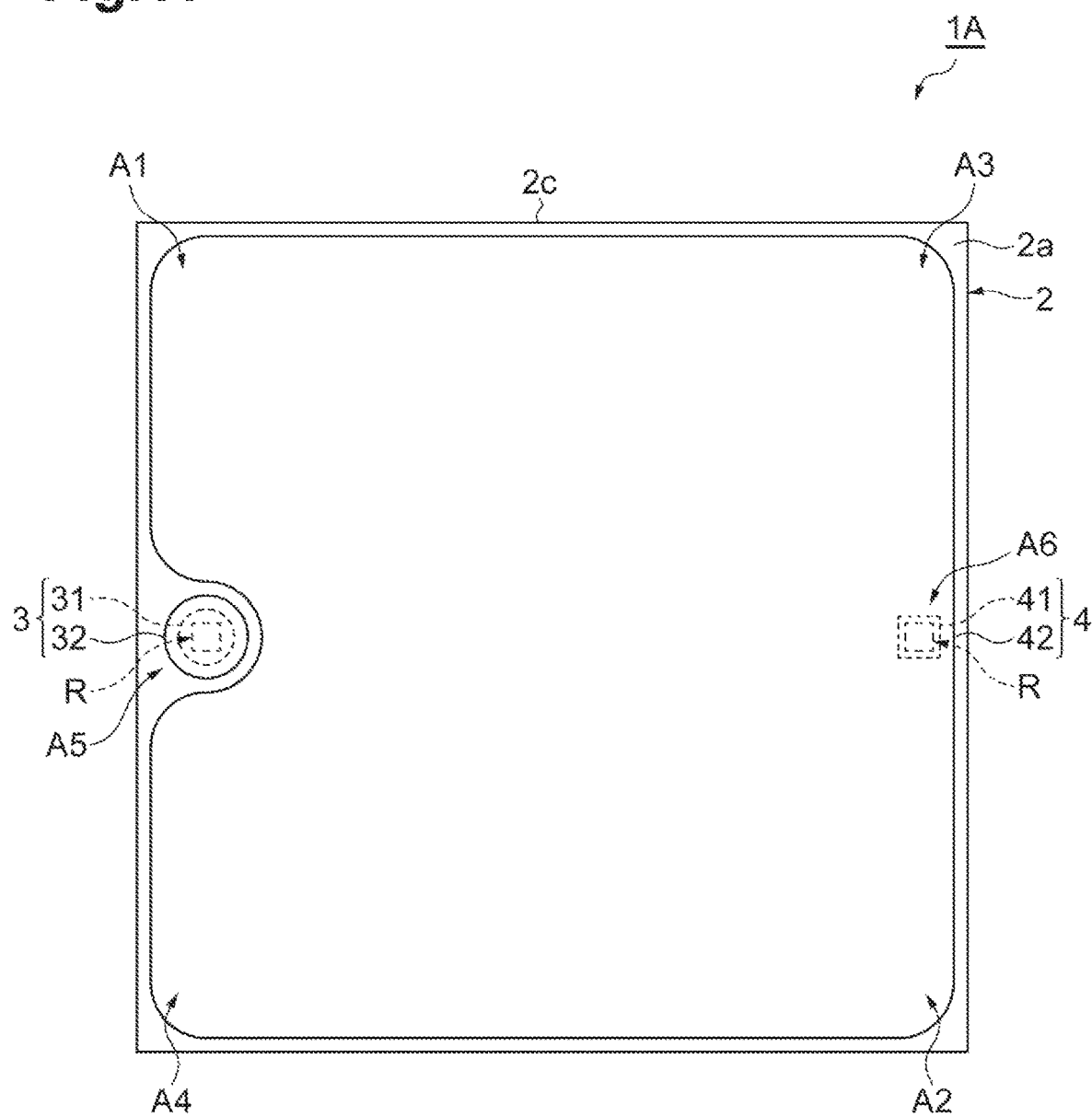
FIG. 11 is a top view of a piezoelectric element according to a first modification example.

FIG. 11 is a top view of a piezoelectric element according to a first modification example. As illustrated in FIG. 11, a piezoelectric element 1A according to the first modification example differs from the piezoelectric element 1 according to the embodiments in the arrangement of external electrodes 3 and 4 and the shape of the external electrode 4. That is, electrode layers 31 and 32 of an external electrode 3 are provided at an intermediate part A5 placed between a corner part A1 and a corner part A4. An electrode layer 41 of an external electrode 4 is provided at an intermediate part A6 placed between a corner part A2 and a corner part A3. An electrode layer 42 of the external electrode 4 has a round corner at each of the corner parts A1 to A4 and the intermediate part A5 when seen in a principal surface opposing direction.

Although not illustrated, an inner electrode 6 is provided at the intermediate part A6 in a way corresponding to the electrode layer 41. An inner electrode 7 has a round corner at each of the corner parts A1 to A4 and the intermediate part A6. An inner electrode 8 is disposed at the intermediate part A5 in a way corresponding to the electrode layer 31. An inner electrode 9 has a round corner at each of the corner parts A1 to A4 and the intermediate part A5. A plurality of through-hole conductors 10a and 10b is disposed at the intermediate part A5 in a way corresponding to the electrode layer 31. A plurality of through-hole conductors 20a and 20b is disposed at an intermediate part A6 in a way corresponding to the electrode layer 41.

Figure 12:
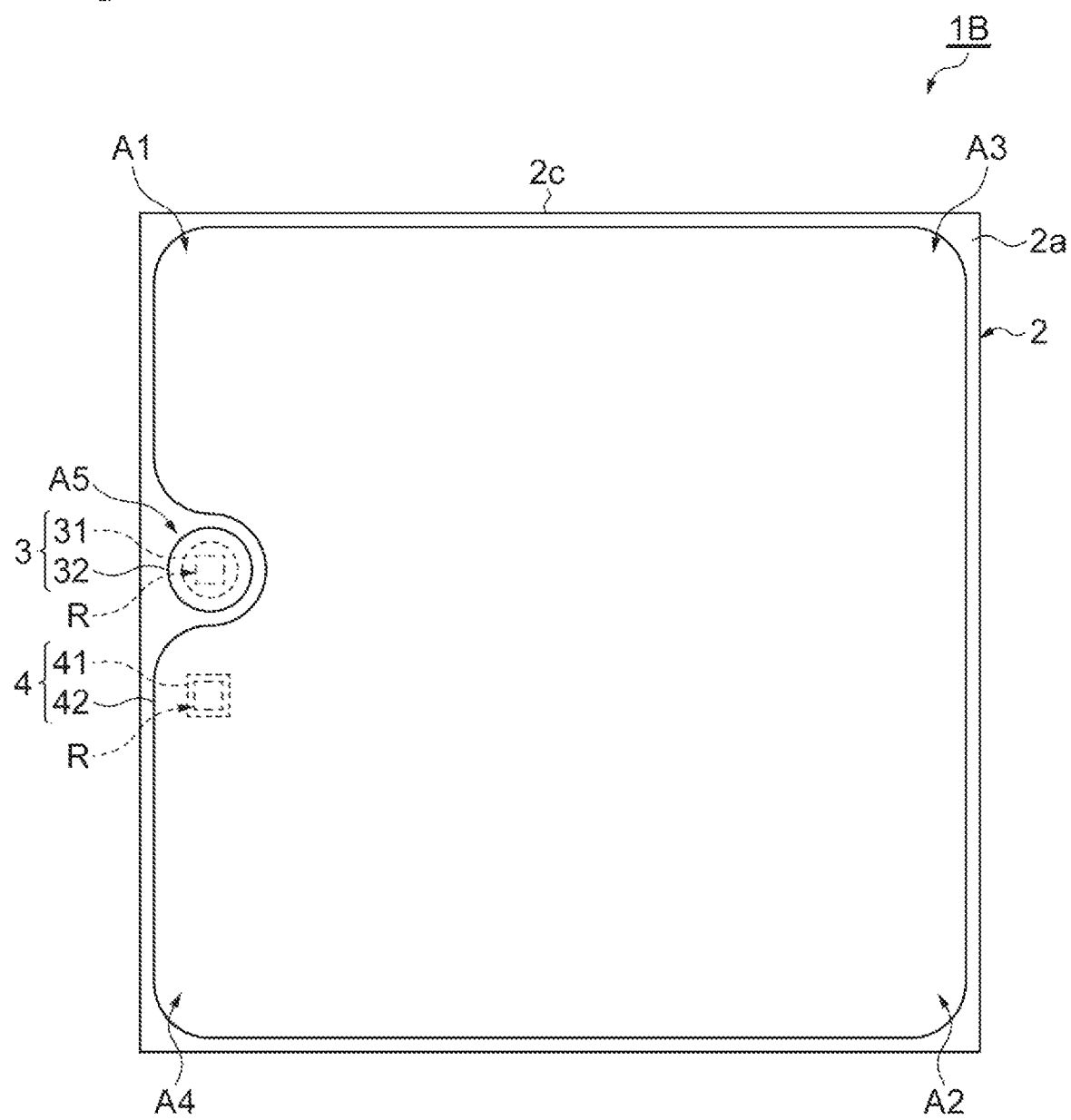
FIG. 12 is a top view of a piezoelectric element according to a second modification example.

FIG. 12 is a top view of a piezoelectric element according to a second modification example. As illustrated in FIG. 12, a piezoelectric element 1B according to a second modification example differs from the piezoelectric element 1 according to the embodiments in the arrangement of external electrodes 3 and 4 and the shape of the external electrode 4. That is, an external electrode 3, and an electrode layer 41 of an external electrode 4 are provided at an intermediate part A5. The external electrode 3 and the electrode layer 41 are disposed side by side in this order from a corner part A1 toward a corner part A4. An electrode layer 42 of the external electrode 4 has a round corner at each of the corner parts A1 to A4 and the intermediate part A5 when seen in a principal surface opposing direction.

Although not illustrated, an inner electrode 6 is provided at the intermediate part A5 in a way corresponding to the electrode layer 41. An inner electrode 7 has a round corner at each of the corner parts A1 to A4 and the intermediate part A5. An inner electrode 8 is provided at the intermediate part A5 in a way corresponding to an electrode layer 31. An inner electrode 9 has a round corner at each of the corner parts A1 to A4 and the intermediate part A5. A plurality of through-hole conductors 10a and 10b is disposed at the intermediate part A5 in a way corresponding to the electrode layer 31. A plurality of through-hole conductors 20*a* and 20*b* is disposed at the intermediate part A5 in a way corresponding to the electrode layer 41.

As described above, since the external electrodes 4 and 5 and the inner electrodes 7 and 9 also have round corners in the piezoelectric elements 1A and 1B, it is possible to control cracks in piezoelectric body layers 11 and 12 in a way similar to the piezoelectric element 1. A plurality of through-hole conductors 10*a*, 10*b*, 20*a*, and 20*b* is not necessarily provided at corner parts A1 to A4, and intermediate parts A5 and A6 and may be provided in a different part of a piezoelectric element body 2 when seen in a principal surface opposing direction.

In each of piezoelectric elements 1, 1A, and 1B, a plurality of through-hole conductors 10*a* may be replaced with one through-hole conductor with a large diameter, a plurality of through-hole conductors 10*b* may be replaced with one through-hole conductor with a large diameter, a plurality of through-hole conductors 20*a* may be replaced with one through-hole conductor with a large diameter, and a plurality of through-hole conductors 20*b* may be replaced with one through-hole conductor with a large diameter. Piezoelectric elements 1, 1A, and 1B are not necessarily laminated piezoelectric elements. That is, a piezoelectric element body 2 may include one piezoelectric body layer.

An external electrode 3 may not include an electrode layer 31, and an electrode layer 32 may be directly connected to a plurality of through-hole conductors 10*a*. An external electrode 4 may not include an electrode layer 41, and an electrode layer 42 may be directly connected to a plurality of through-hole conductors 20*a*. The external electrode 3 not necessarily includes a circular shape, and may include a star shape, an ellipse shape, or the like when seen in a principal surface opposing direction. At least one of external electrodes 4 and 5 and inner electrodes 7 and 9 only need to include one or more round corners when seen in a principal surface opposing direction.

What is claimed is:

1. A piezoelectric element comprising:
   a piezoelectric body layer having rectangular first and second principal surfaces opposing each other and including a piezoelectric material;
   a first electrode provided on the first principal surface;
   a second electrode provided on the first principal surface in such a way that the second electrode is separated from the first electrode;
   a third electrode provided on the second principal surface in such a way that the third electrode opposes the first electrode; and
   a first through-hole conductor penetrating the piezoelectric body layer and connected to the second electrode and the third electrode,
   wherein the first electrode has a round corner when seen in an opposing direction of the first and second principal surfaces.

2. The piezoelectric element according to claim 1, wherein the second electrode includes a first electrode layer connected to the first through-hole conductor, and a second electrode layer configured to cover the first electrode layer, and
   an area of the second electrode layer is larger than an area of the first electrode layer when seen in the opposing direction.

3. The piezoelectric element according to claim 2, wherein a content rate of the piezoelectric material in the second electrode layer is lower than a content rate of the piezoelectric material in the first electrode layer.

4. The piezoelectric element according to claim 1, further comprising:
   a fourth electrode provided on the second principal surface in such a way that the fourth electrode is separated from the third electrode; and
   a second through-hole conductor penetrating the piezoelectric body layer and connected to the first electrode and the fourth electrode,
   wherein the first through-hole conductor is disposed at a first corner part of the piezoelectric body layer when seen in the opposing direction,
   the second through-hole conductor is disposed at a second corner part diagonal to the first corner part when seen in the opposing direction, and
   the first electrode has a round corner at each of a pair of third corner parts of the piezoelectric body layer when seen in the opposing direction, the pair of third corner parts being next to the first and second corner parts.

5. The piezoelectric element according to claim 1, wherein the third electrode has a round corner when seen in the opposing direction.

* * * * *